(12) United States Patent
Hunter

(10) Patent No.: US 10,539,303 B2
(45) Date of Patent: Jan. 21, 2020

(54) AIRFIELD LIGHT

(71) Applicant: Eaton Intelligent Power Limited, Dublin (IE)

(72) Inventor: Vivian Loomis Hunter, Simsbury, CT (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/998,428

(22) Filed: Aug. 15, 2018

(65) Prior Publication Data

US 2019/0086061 A1 Mar. 21, 2019

Related U.S. Application Data

(60) Provisional application No. 62/545,577, filed on Aug. 15, 2017.

(51) Int. Cl.
| | |
|---|---|
| *F21V 19/00* | (2006.01) |
| *B64F 1/20* | (2006.01) |
| *H05K 1/02* | (2006.01) |
| *F21W 111/06* | (2006.01) |
| *F21Y 115/10* | (2016.01) |
| *F21Y 107/20* | (2016.01) |

(52) U.S. Cl.
CPC ............ *F21V 19/0015* (2013.01); *B64F 1/20* (2013.01); *H05K 1/028* (2013.01); *F21W 2111/06* (2013.01); *F21Y 2107/20* (2016.08); *F21Y 2115/10* (2016.08); *H05K 2201/10106* (2013.01); *H05K 2201/10121* (2013.01)

(58) Field of Classification Search
CPC ... F21V 19/0015; F21V 7/0016; H05K 1/028; H05K 2201/10106; H05K 2201/10121; F21Y 2107/20; F21Y 2107/70; F21Y 2107/60; F21Y 2115/10; B64F 1/20; F21W 2111/06; B64D 2203/00
See application file for complete search history.

(56) References Cited

U.S. PATENT DOCUMENTS 5,806,965 A * 9/1998 Deese ................... B64F 1/20
362/237
8,564,456 B2 10/2013 Selevan
8,591,073 B2 11/2013 Peck et al.
9,206,961 B1 12/2015 Bastiani et al.
(Continued)

FOREIGN PATENT DOCUMENTS

| DE | 19743826 A1 | 4/1999 |
| FR | 2797940 A1 | 3/2001 |
| WO | 2015002928 A1 | 1/2015 |

OTHER PUBLICATIONS

International Search Report and Written Opinion; PCT/IB2018/056143, dated Nov. 11, 2018; Applicant: Eaton Intelligent Power Limited.

*Primary Examiner* — Kevin Quarterman

(74) *Attorney, Agent, or Firm* — Stinson LLP

(57) ABSTRACT

An airfield light includes a light assembly mounted on a base and a transparent cover disposed over the light assembly and secured to the base. The light assembly includes a curved LED (light emitting diode) assembly having a circuit board with at least a portion that is curved along its length. A plurality of LEDs are spaced apart along the length of the circuit board and are configured to emit light through the transparent cover.

16 Claims, 7 Drawing Sheets

(56) References Cited

U.S. PATENT DOCUMENTS

| | | | |
|---|---|---|---|
| 2006/0082999 A1* | 4/2006 | Klein | F21V 5/04 |
| | | | 362/311.02 |
| 2008/0002410 A1 | 1/2008 | Burton et al. | |
| 2008/0049422 A1 | 2/2008 | Trenchard et al. | |
| 2008/0247161 A1* | 10/2008 | Hulsey | B63B 45/04 |
| | | | 362/227 |
| 2010/0091507 A1* | 4/2010 | Li | F21V 7/09 |
| | | | 362/470 |
| 2011/0235322 A1* | 9/2011 | Fields | F21V 5/00 |
| | | | 362/230 |
| 2011/0305014 A1* | 12/2011 | Peck | F21V 5/02 |
| | | | 362/235 |
| 2015/0103515 A1* | 4/2015 | Bosua | F21V 29/83 |
| | | | 362/157 |
| 2015/0308628 A1 | 10/2015 | Athalye et al. | |
| 2017/0208693 A1 | 7/2017 | Van Bommel et al. | |

* cited by examiner

AIRFIELD LIGHT

CROSS-REFERENCE TO RELATED APPLICATION

The present application claims the benefit of U.S. Provisional Application No. 62/545,577, filed Aug. 15, 2017, the entirety of which is hereby incorporated by reference.

FIELD OF THE DISCLOSURE

The present disclosure generally relates to lights, and more specifically airfield lights such as lights used along runways or taxiways.

BACKGROUND OF THE DISCLOSURE

Airfield lights are used for various purposes, such as to indicate to airfield personnel and pilot boundaries and/or intended directions of travel along runways and/or taxiways.

SUMMARY OF THE DISCLOSURE

In one aspect, an airfield light generally comprises a light assembly, and a cover disposed over the light assembly. The light assembly comprises a curved LED assembly. The curved LED assembly includes a circuit board having at least a portion that is curved along its length, and a plurality of LEDs spaced apart along the length of the circuit board.

Other features of the present disclosure will be in part apparent and in part pointed out herein.

BRIEF DESCRIPTION OF THE DRAWINGS

Corresponding reference characters indicate corresponding parts throughout the drawings.

DETAILED DESCRIPTION

Figure 1:
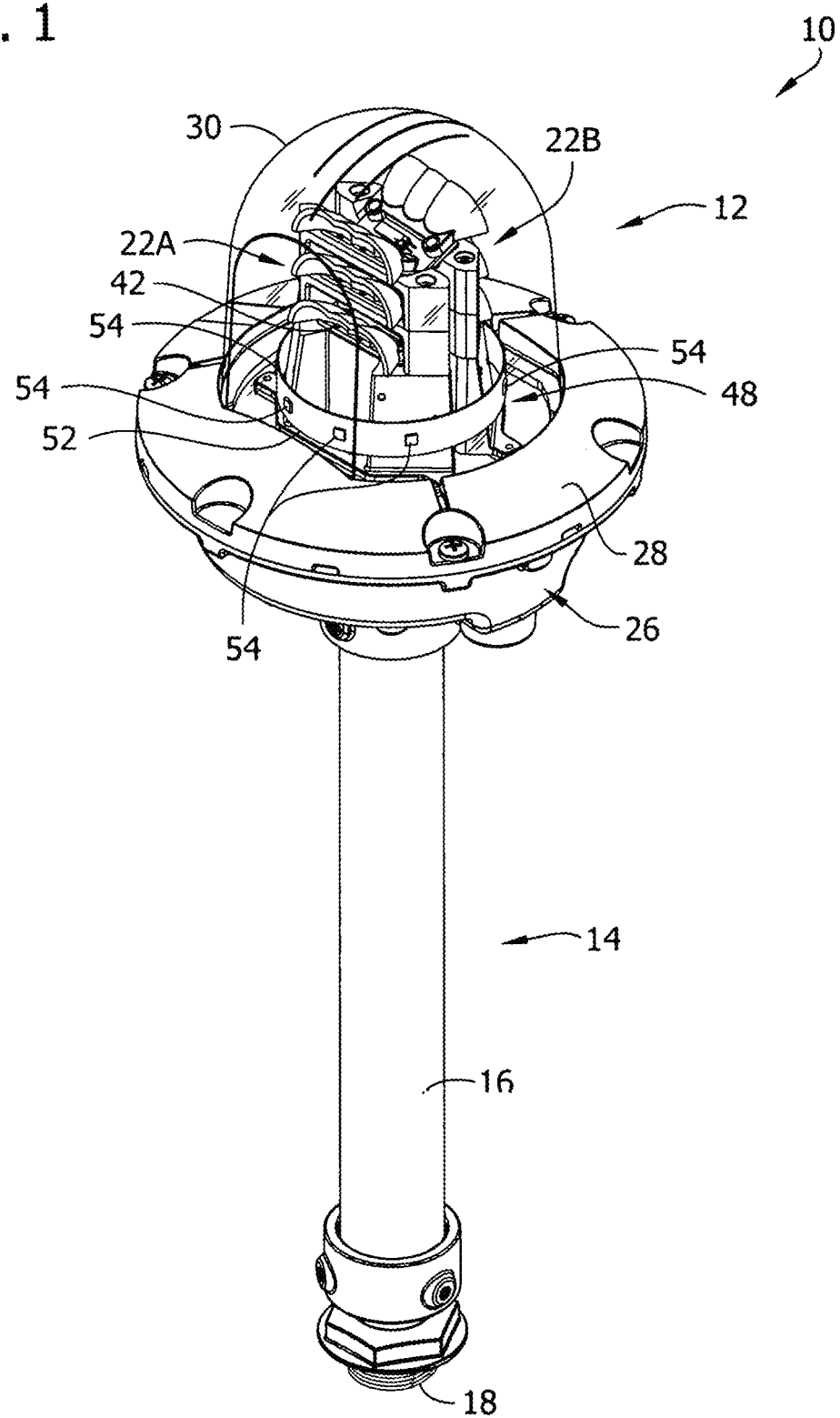
FIG. 1 is a front perspective of an airfield light of the present disclosure including a curved LED assembly.

Referring to FIG. 1, an embodiment of an airfield light is generally indicated at reference number 10. The airfield light 10 can be used for various purposes. For example, several of the airfield lights 10 may be positioned one after another along a runway for indicating boundaries, intended direction of travel, and/or distance to the end of the runway, etc. As will be described in further detail below, the light 10 has a modular design permitting the light to be configured in manufacture to meet a variety of lighting needs.

The illustrated embodiment of the light 10 is an elevated airfield light (e.g., a high intensity runway light) including a head 12 and a stem 14, each indicated generally in FIG. 1. The stem 14 includes a post 16, such as a pipe, for elevating the head 12. A threaded connector 18 is provided at a lower end of the stem 14 for mounting the light 10 on a suitable base. The head 12 includes first and second (front and rear) light assemblies 22A, 22B, a base 26, a collar 28, and a cover 30 for covering the light assemblies 22A, 22B. As explained in more detail below, the first light assembly 22A is configured to emit light of a selected first color generally in a first direction (e.g., forward), and the second light assembly 22B is configured to emit light of a selected second color in a second direction (e.g., rearward), which may be generally opposite the first direction. The first and second colors may be the same color or may be different colors.

Figure 3:
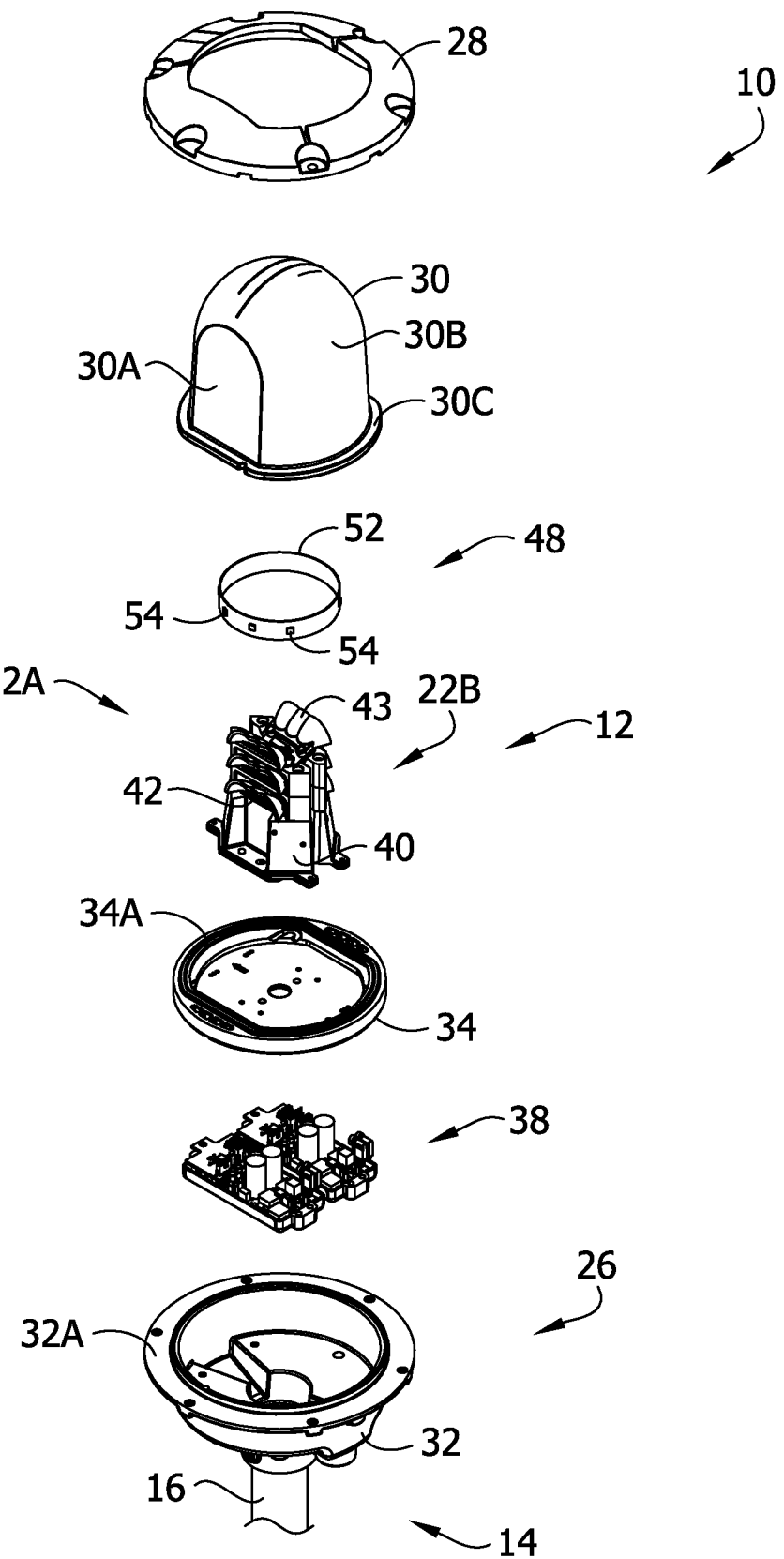
FIG. 3 is an exploded front perspective of an upper portion of the airfield light.

Referring to FIG. 3, the cover 30 is generally colorless, although it may be colored and/or tinted. The cover 30 has a generally dome shape including a rounded top portion, a first (front) truncated portion 30A (i.e., first planar portion) generally opposing the first light assembly 22A through which light emitted from the first light assembly is transmitted, and a second (rear) truncated portion 30B (i.e., second planar portion) generally opposing the second light assembly 22B through which light emitted from the second light assembly is transmitted. The interior and exterior surfaces of the first and second truncated portions 30A, 30B are generally planar and parallel to each other.

Figure 2:
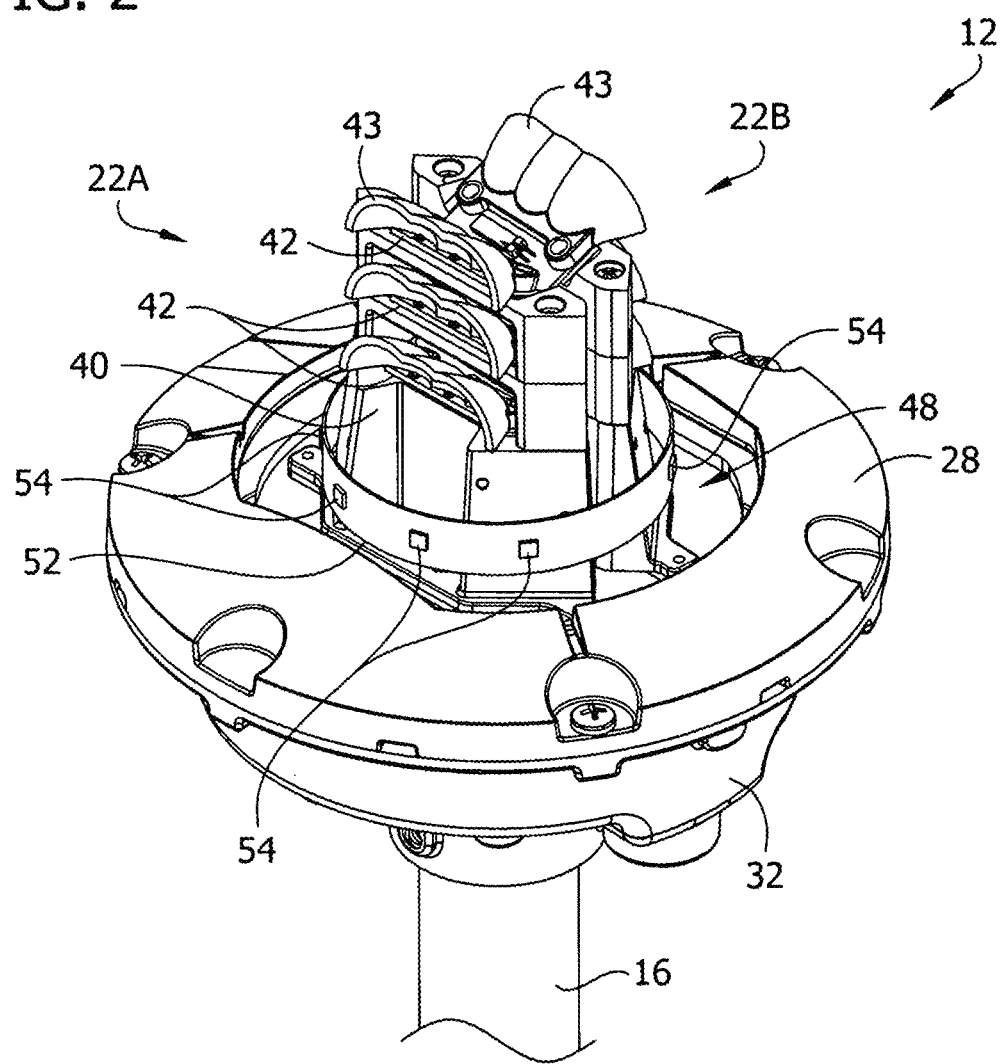
FIG. 2 is an enlarged, partial front perspective of the airfield light with a cover removed therefrom.

Referring still to FIG. 3, the base 26 includes a housing 32 defining a cavity, a platform 34 disposed over an open upper end of the housing, and the collar 28 secured (e.g., by fasteners—not shown) to a flange 32A of the housing 32. Electronics and/or electrical components 38 for operating the light assemblies are positioned in the housing 26 and are electrically connected to the light assemblies 22A, 22B (e.g., by suitable cables or wiring). The light assemblies 22A, 22B are mounted on the platform 34, as explained in more detail below. In FIG. 2, a gasket 34A is shown on an upper end of the platform 34. In assembly, a lower flange 30C of the cover 30 is sandwiched between the platform 34 (below) and the gasket 34A (above). The collar 28 secures the cover 30 to the base 26 by clamping the gasket 34A and flange 30C of the cover between the collar and the platform 34. The gasket 34A inhibits ingress of liquid and debris into the light 10 to protect the light assemblies 22A, 22B, electronics and/or electrical components 38. A lower end of the housing 26 is mounted on an upper end of the stem 14. Cables or wiring from the electronics and/or electrical components 38 in the housing 26 are fed through the stem 14 and out a lower end of the stem. The base 26 and stem 14 may be formed from metal (e.g., cast aluminum) or other suitable material.

As shown in FIG. 2, each light assembly 22A, 22B generally includes a support 40, at least one directional illuminator 42 (e.g., a directional LED module) and at least one curved LED (light emitting diode) assembly, generally indicated at 48. In the illustrated embodiment, the directional illuminators 42 are LED modules (i.e., LED assemblies or LED illuminators). The LED modules 42 include LEDs mounted on a printed circuit board (PCB), such as a rigid PCB, and reflectors 43 directing the light emitted from the LEDs to a desired direction (e.g., forward or rearward, respectively). It is understood that the at least one directional illuminator may be of other designs and constructions without necessarily departing from the scope of the present disclosure. For example, the directional illuminator may not be an LED module.

In the illustrated embodiment, the support 40 functions as a heat sink for the at least one directional illuminator 42 (e.g., a directional LED module) and the at least one curved LED assembly 48. The support 40 can be formed of a suitable thermally conductive and heat-dissipating material, such as metal (e.g., cast aluminum). The illustrated heat sink 40 includes an upper LED module mounting surface. The directional LED module 42 (e.g., high intensity LED module) is mounted on the upper LED module mounting surface. Further details on the head 12 of the air field light 10 may be found in U.S. patent application Ser. No. 15/975,404, the entirety of which is hereby incorporated by reference.

The curved LED assembly 48 includes a circuit board 52 having at least a portion that is curved along its length, and a plurality of LEDs 54 mounted on the circuit board. In one or more embodiments, the circuit board 52 may comprise a flexible printed circuit board (PCB) or a flex-rigid PCB to allow the circuit board to bend into a suitable shape. In the illustrated embodiment, the circuit board 52 has a generally circular shape that surrounds the light assemblies 22A, 22B adjacent a lower end of the supports 40. For example, the illustrated circuit board 52 is curved about a generally vertical axis, such as the vertical axis of the light 10, or described another way, the circuit board is curved within a generally horizontal plane. In other embodiments, the circuit board may be curved about a generally horizontal axis, or described another way, the circuit board is curved within a generally vertical plane. In other embodiments, the circuit board may have other shapes, such as rectangular or oval or other shapes, that surround the support. In the illustrated embodiment, the curved LED assembly 48 is mounted on the support 40, at the base of the light assemblies 22A, 22B adjacent the platform 34. The curved LED assembly 48 may be mounted at other positions on the light assemblies 22A, 22B. The curved LED assembly 48 may be attached to the support 40 by any suitable means, such as by adhesive or mechanical fasteners (e.g., screws). In one embodiment, the curved LED assembly 48 is generally spaced apart from the light assemblies 22A, 22B and only engages the light assemblies at its point of attachment to the light assemblies.

Figure 4:
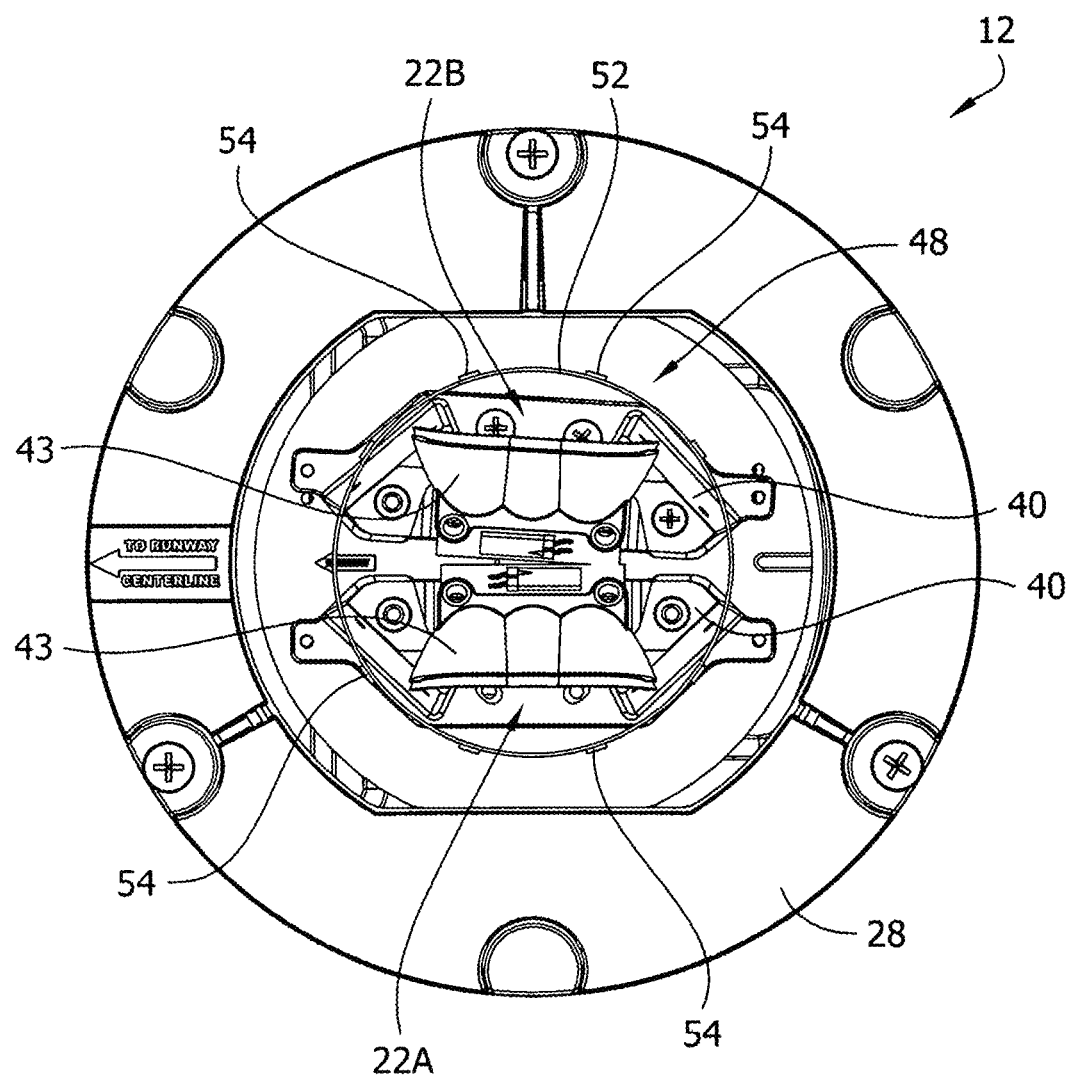
FIG. 4 is a top plan view of the airfield light with the cover removed therefrom.
Figure 5:
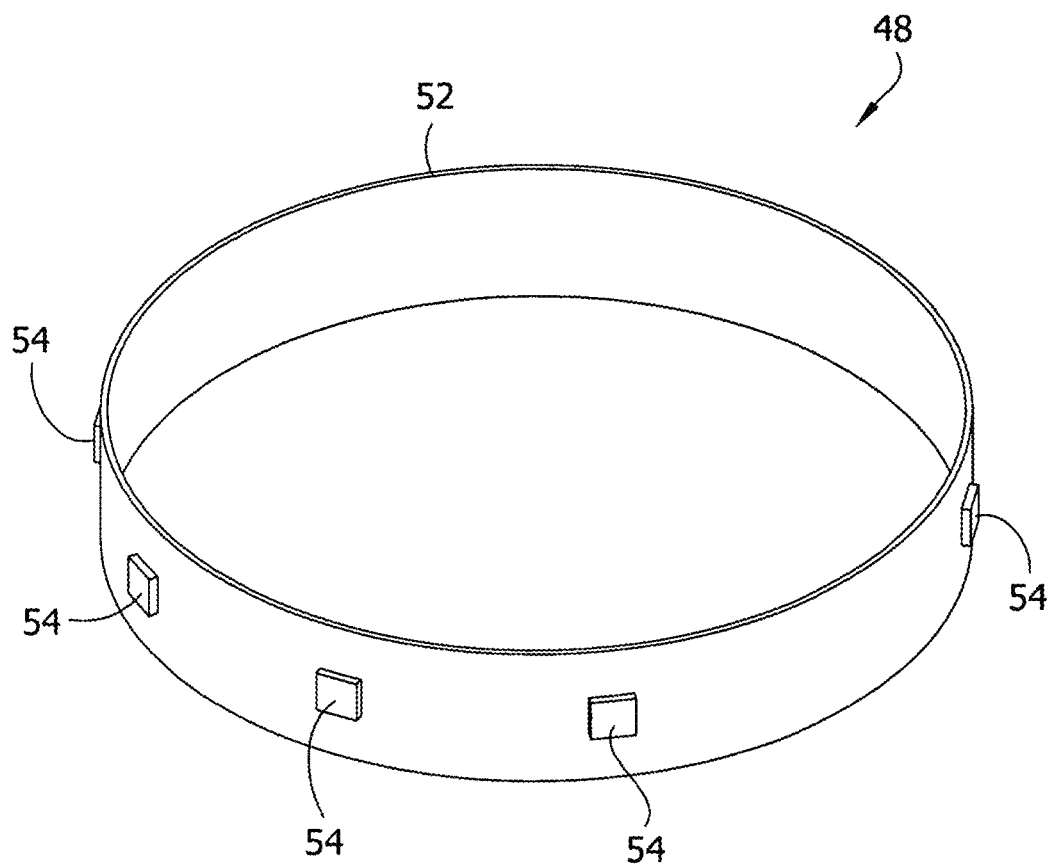
FIG. 5 is an enlarged perspective of the curved LED assembly.

The LEDs 54 are spaced apart from one another along the length (e.g., arcuate length) of the circuit board 52. As shown in FIG. 4, there are 8 LEDs 54 on the circuit board, with 4 LEDs facing generally in a forward direction and 4 LEDs facing generally in a rearward direction. That is, a first set of LEDs 54 (e.g., 4 forward facing LEDs) are associated with the first light assembly 22A and emit light in generally the first (e.g., forward) direction, and a second set of LEDs (e.g., 4 rearward facing LEDs) are associated with the second light assembly 22B and emit light in generally the second (e.g., rearward) direction. The LEDs 54 in the first set of LEDs match the color of the first light assembly 22A and are generally uniformly spaced apart from one another along the length of the circuit board 52, although they may be non-uniformly spaced. The LEDs 54 in the second set of LEDs match the color of the second light assembly 22A and are generally uniformly spaced apart from one another along the length of the circuit board 52, although they may be non-uniformly spaced. It is understood that there may be any suitable number of LEDs 54 on the circuit board(s) 52 and the LEDs may be other than uniformly spaced apart from one another. For example, the LEDs 54 may be primarily disposed forward (e.g., spaced in the first direction) of the first light assembly 22A and rearward (e.g., spaced in the second direction) of the second light 22B (e.g., not disposed along the sides of the light assemblies). The LEDs 54 are electrically coupled to the electronics 38 via the circuit board 52, in a way that is generally understood in the art. The LEDs 54 may have colors matching the color of the light assembly 22A, 22B to which they are associated.

Figure 7:
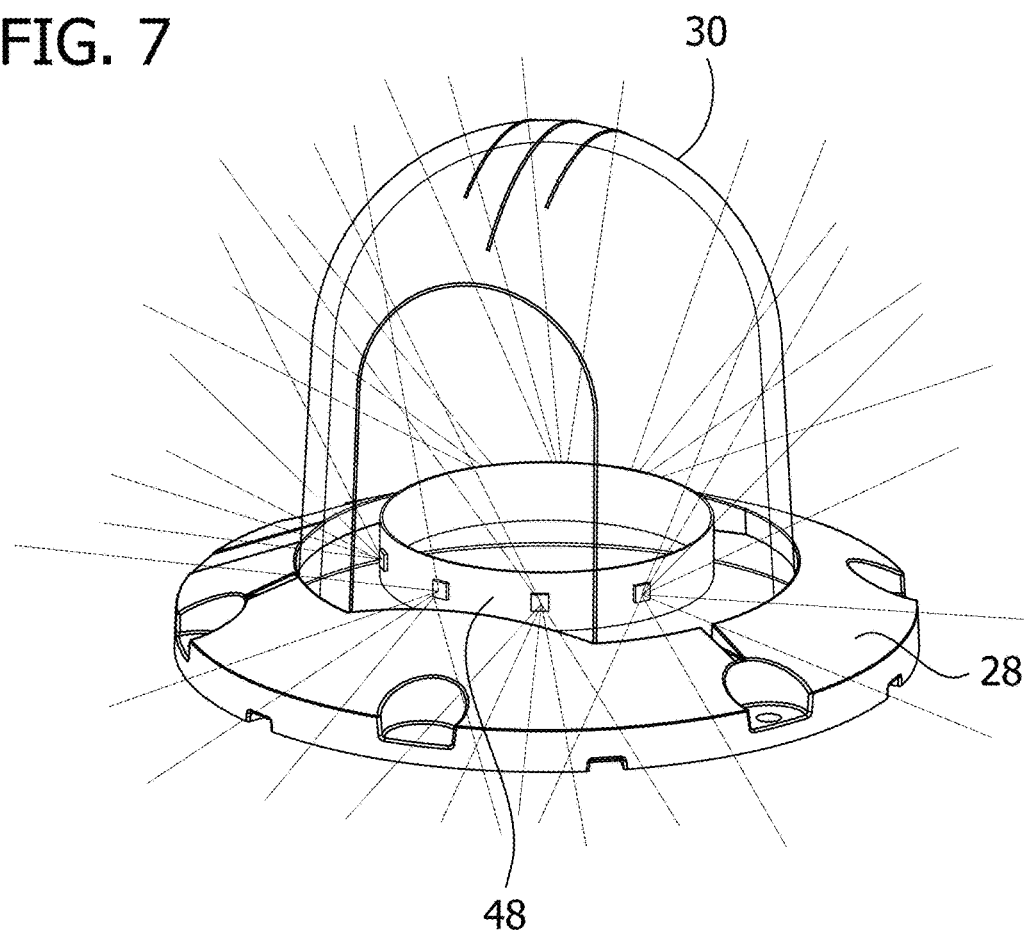
FIG. 7 is a ray diagram of the first embodiment of the airfield light.
Figure 8:
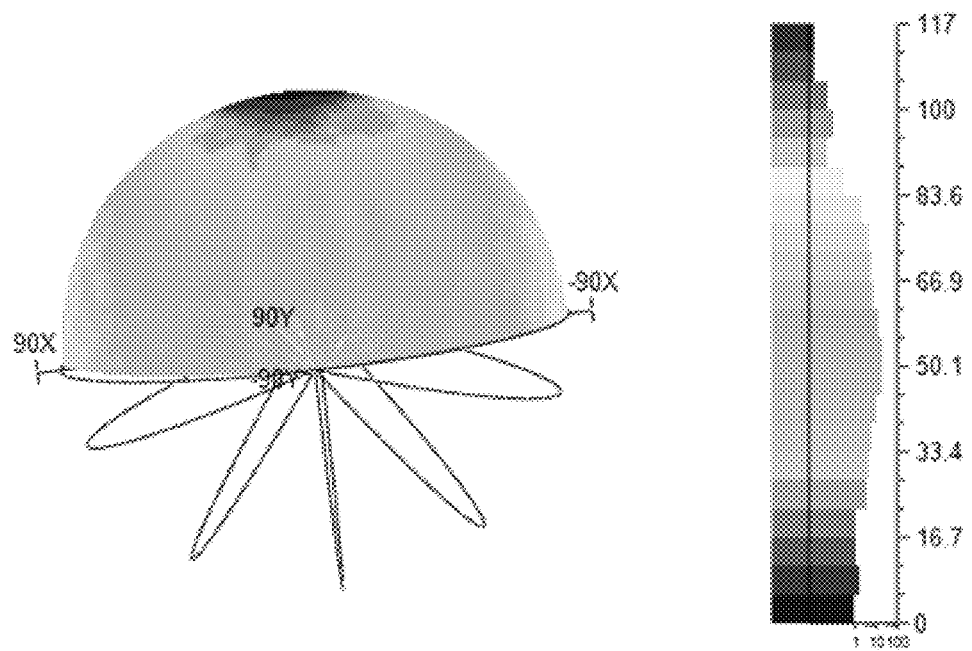
FIG. 8 is light intensity mapping of the first embodiment of the airfield light.

The illustrated curved LED assembly 48 creates a halo effect to provide a signal to pilots flying above the airfield—as shown in FIGS. 7 and 8. In particular, the cover 30 partially reflects light emitted from the curved LED assembly 48 to create the halo effect, whereby the first light is transmitted through a first (front) half of the cover 30 including a first (front) half of the rounded top portion of the cover, and the second light is transmitted through a second (rear) half of the cover including a second (rear) half of the rounded top portion. In this way, light emitted by the airfield light 10 is visible by pilots flying above the airfield. Moreover, light from the curved LED assembly 48 is transmitted through the cover multi-directionally. For example, as shown in FIGS. 7 and 8, light from the LEDs 54 of the first set is emitted from the LEDs and transmitted through the cover 30 in forward, lateral, and upward directions, and light from the LEDs of the second set is emitted from the LEDs and transmitted through the cover in rearward, lateral, and upward directions. Where the light assemblies 22A, 22B of the airfield light 10 already create a halo effect, the curved LED assembly 48 will further facilitate and contribute to the halo effect of the airfield light. In this manner, the curved LED assembly 48 provides an easy and cost affordable way to increase the brightness of an existing airfield light.

Figure 6:
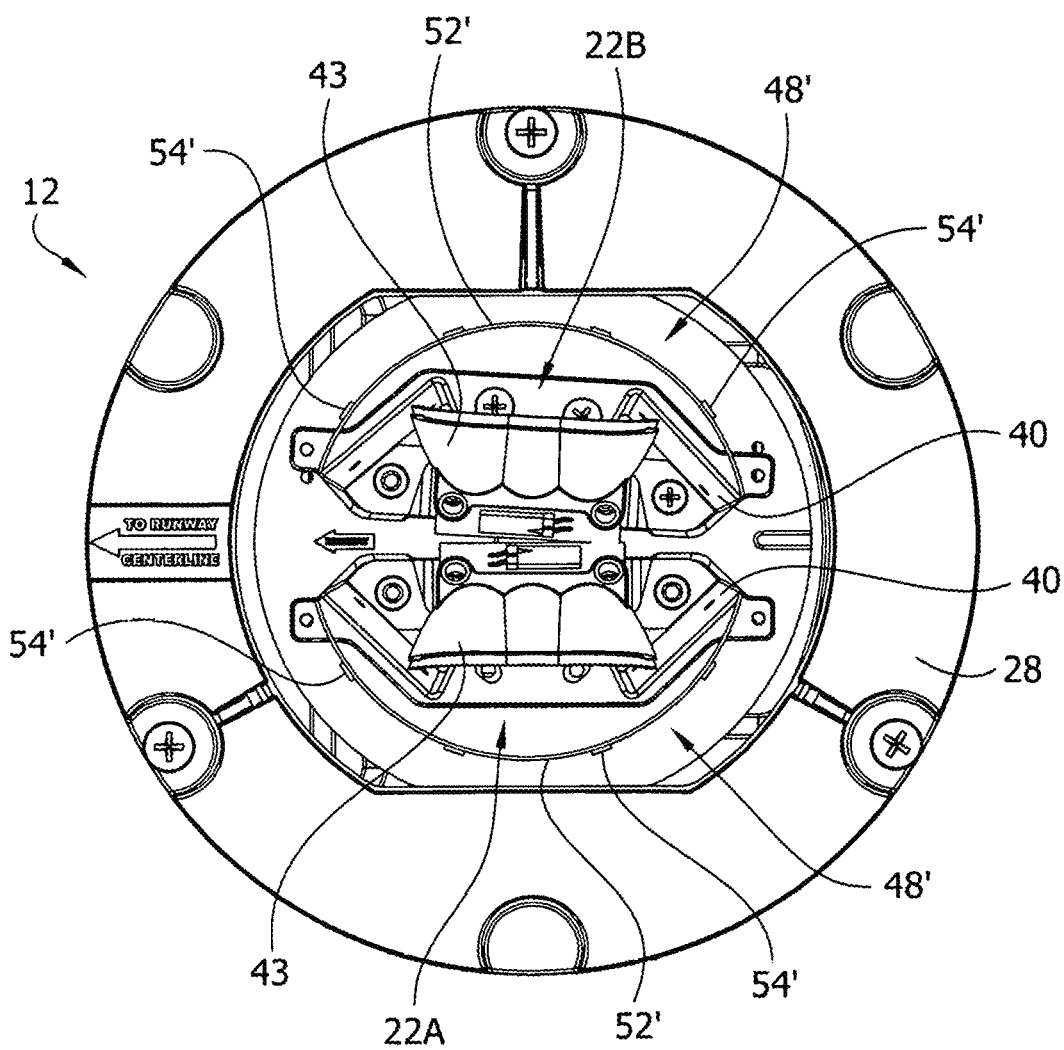
FIG. 6 is a top plan view of another embodiment of an airfield light with a cover removed therefrom showing two curved LED assemblies.

Referring to FIG. 6, in another embodiment, the curved LED assembly may not completely surround the supports 40 of the light assemblies 22A, 22B. For example, as shown in FIG. 6, the airfield light 10 includes two curved LED assemblies 48' (broadly, a single curved LED assembly with two parts). Each curved LED assembly 48' comprises arcuate circuit boards 52' (e.g., flexible or flex-rigid PCBs) that extend partially around the support 40 of each light assembly 22A, 22B and a plurality of LEDs 54' on each circuit board. The circuit boards 52' may be of other curved shapes without departing from the scope of the present disclosure. In the illustrated embodiment, opposite ends of each curved LED assembly 48' are attached to opposite sides of the support 40. When the curved LED assembly 48' is attached to the support 40, the flexible circuit board 52 bends into the arcuate shape that partially surrounds the light assembly 22A, 22B. Each circuit board 52' includes a set of LEDs 54' (e.g., set of 4 LEDs) generally uniformly spaced apart from one another along the length of the circuit board which match the color of the light assembly 22A, 22B with which it is associated. The features of the first curved LED assembly 48 apply equally to this second embodiment of the curved LED assembly 48', and, thus, for ease of comprehension, where analogous parts are used, reference numerals with a trailing prime (') are employed.

Modifications and variations of the disclosed embodiments are possible without departing from the scope of the invention defined in the appended claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. An airfield light comprising:
   a light assembly mounted on a base of the airfield light; and
   a transparent cover disposed over the light assembly and secured to the base,
   wherein the light assembly comprises a curved LED (light emitting diode) assembly and a first directional illuminator separate from the curved LED assembly, the curved LED assembly including a circuit board having at least a portion that is curved along its length, a plurality of LEDs spaced apart along the length of the circuit board and configured to emit light through the transparent cover,
   wherein the first directional illuminator is configured to emit light in a first direction, and
   wherein the LEDs on the curved LED assembly are configured to emit light in generally the first direction.

2. The airfield light set forth in claim 1, wherein the circuit board comprises a flexible printed circuit board (PCB).

3. The airfield light set forth in claim 1, wherein the circuit board comprises a flex-rigid PCB.

4. The airfield light set forth in claim 1, wherein the circuit board has a generally circular shape.

5. The airfield light set forth in claim 1, wherein the curved LED assembly comprises first and second curved LED assemblies, wherein the circuit board of each of the first and second curved LED assemblies has a generally arcuate shape.

6. The airfield light set forth in claim 1, wherein the light assembly further includes a second directional illuminator separate from the curved LED assembly and the first directional illuminator, the second directional illuminator configured to emit light in a second direction.

7. The airfield light set forth in claim 6, wherein a portion of the LEDs on the curved LED assembly emit light in generally the second direction.

8. The airfield light set forth in claim 7, wherein the first and second directions are generally opposite of one another.

9. The airfield light set forth in claim 6, wherein the curved LED assembly comprises first and second curved LED assemblies, the first curved LED assembly including LEDs configured to emit light in generally the first direction and the second curved LED assembly including LEDs configured to emit light in generally the second direction.

10. The airfield light set forth in claim 7, wherein the first and second directional illuminators each include an LED and a reflector associated with the LED.

11. The airfield light set forth in claim 10, wherein the LED of the first directional illuminator and the portion of the LEDs of the curved LED assembly that emit light in generally the first direction are configured to emit light having the same color.

12. The airfield light set forth in claim 11, wherein the LED of the second directional illuminator and the portion of the LEDs of the curved LED assembly that emit light in generally the second direction are configured to emit light having the same color.

13. The airfield light set forth in claim 1, wherein the light assembly further includes a support on which the first directional illuminator is mounted, wherein the curved LED assembly at least partially surrounds the support.

14. The airfield light set forth in claim 13, wherein the curved LED assembly surrounds the support.

15. The airfield light set forth in claim 13, wherein the curved LED assembly partially surrounds the support.

16. The airfield light set forth in claim 13, wherein the curved LED assembly is mounted on the support.

* * * * *